United States Patent
Huang

(10) Patent No.: US 7,271,498 B2
(45) Date of Patent: Sep. 18, 2007

(54) BUMP ELECTRODES HAVING MULTIPLE UNDER BALL METALLURGY (UBM) LAYERS

(75) Inventor: Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 118 days.

(21) Appl. No.: 10/710,419

(22) Filed: Jul. 9, 2004

(65) Prior Publication Data

US 2005/0006759 A1    Jan. 13, 2005

(30) Foreign Application Priority Data

Jul. 10, 2003    (TW)    ............................... 92118830 A

(51) Int. Cl.
*H01L 23/488*    (2006.01)
*H01L 21/44*    (2006.01)

(52) U.S. Cl. ..................... 257/781; 257/736; 257/738; 257/E23.021

(58) Field of Classification Search ........ 257/735–738, 257/780–781
See application file for complete search history.

(56) References Cited

U.S. PATENT DOCUMENTS

| | | | | |
|---|---|---|---|---|
| 4,927,505 A | * | 5/1990 | Sharma et al. | 205/123 |
| 5,461,261 A | * | 10/1995 | Nishiguchi | 257/781 |
| 5,631,499 A | * | 5/1997 | Hosomi et al. | 257/737 |
| 5,648,686 A | * | 7/1997 | Hirano et al. | 257/778 |
| 6,020,640 A | * | 2/2000 | Efland et al. | 257/751 |
| 6,232,212 B1 | * | 5/2001 | Degani et al. | 438/612 |
| 6,451,681 B1 | * | 9/2002 | Greer | 438/601 |
| 6,462,426 B1 | * | 10/2002 | Kelkar et al. | 257/781 |
| 6,525,422 B1 | * | 2/2003 | Ono et al. | 257/737 |
| 6,770,958 B2 | * | 8/2004 | Wang et al. | 257/673 |
| 7,008,867 B2 | * | 3/2006 | Lei | 438/613 |
| 2003/0124832 A1 | * | 7/2003 | Tseng et al. | 438/613 |

* cited by examiner

*Primary Examiner*—Anh Duy Mai
(74) *Attorney, Agent, or Firm*—Jianq Chyun IP Office

(57) ABSTRACT

The present invention provides a wafer structure having a plurality of bonding pad, an adhesion layer, a barrier layer, a wetting layer, a plurality of bump, a first passivation layer and a second passivation layer. The bonding pads are disposed on the active surface of the wafer and exposed by the first passivation layer. The second passivation layer is disposed on the first passivation layer and exposing the bonding pads. An adhesion layer is disposed on the bonding pad and covers a portion of the first passivation layer. The second passivation layer covers the first passivation layer and a portion of the adhesion layer. The barrier layer and the wetting layer are sequentially disposed on the adhesion layer and the bumps are disposed on the wetting layer.

14 Claims, 7 Drawing Sheets

BUMP ELECTRODES HAVING MULTIPLE UNDER BALL METALLURGY (UBM) LAYERS

CROSS REFERENCE TO RELATED APPLICATIONS

This application claims the priority benefit of Taiwan application serial no. 92118830, filed Jul. 10, 2003.

BACKGROUND OF INVENTION

1. Field of Invention

The present invention relates to a package structure and the fabrication method thereof. More particularly, the present invention relates to a wafer structure and the bumping process for the wafer structure.

2. Description of Related Art

In the semiconductor industry, integrated circuits (ICs) manufacture can be categorized as three major stages: fabrication of the wafers, fabrication of the ICs and packaging of the ICs. Among the wafer level packaging processes, flip chip (FC) packaging technology has been widely used and become the main stream nowadays. Because FC packaging technology can shorten the signal transmission path between the chip and the substrate, FC packaging technology is suitable for packaging high speed devices, for example, micron or millimeter wave-length operating chip. Moreover, FC package technology can reduce the package size of the chip and provide packages in sizes close to the chip size. Hence, FC packaging technology is extensively applied in packages for high performance computers, PCM-CIA card, military instruments, personal communication products, watches and liquid crystal displays.

In FC packaging technology, the arrangement of area arrays is mainly employed. The chip (die) having bonding pads disposed on the active surface of the chip is provided, and bumps are formed on the bonding pads of the chip. After flipping over the chip and arrange the active surface of the chip to the substrate, the bumps are electronically and mechanically connected to the contacts of the substrate or the printed circuit board.

FIG. 1 is a cross-sectional view of a conventional bump structure. Referring to FIG. 1, the structure 100 includes a chip 110 and a plurality of bump structures 120 (with only two bumps shown). The chip 110 has an active surface 112, a passivation layer 114 and a plurality of bonding pads 116 (with only two pads shown) on the active surface 112. The bonding pads 116 are exposed by the passivation layer 114, while the passivation layer 114 covers the active surface 112 of the chip 110.

Each of the bump structure 120 includes an under bump metallurgy (UBM) layer 122 and a bump 124. The UBM layer 122 is arranged between the bump 124 and the bonding pad 116, as an interface for connection. The bump 124 can act as an electrical contact of the chip for external connection.

The UBM layer 122 includes an adhesion layer 122a, a barrier layer 122b, and a wetting layer 122c. The adhesion layer 122a can improve adhesion between the bonding pad 116 and the barrier layer 122b. The barrier layer 122b can act as a barrier against diffusion reaction of the bump 124 or the underlying metal. The wetting layer 122c can increase the attachment of the UBM layer 122 to the bumps 124.

However, in the above structure 100, since the peripheral portion of the UBM layer 122 is disposed on the passivation layer 114, the coefficient of thermal expansion (CTE) mismatch between the chip 110 and the bump structure 120 may result in peeling. Especially under high temperature circumstances (such as pre-heating or temperature tests in the module testing process, or under heat produced from IC operation), thermal stress will induce peeling along the interface between the adhesion layer 122a and the passivation layer 114, thus deteriorating the connection between the chip 110 and the bump structure 120. Hence, the performance of the device is degraded and the life of the device is shortened.

SUMMARY OF INVENTION

The present invention provides a wafer structure, which enhances adhesion between the wafer (or chip) and the bumps and extends the life of the device.

The present invention provides a bumping process of forming bumps on the wafer, which can afford better connection between the wafer and the bump structure, so as to improve the reliability of the bumps and the quality of the package structure.

As embodied and broadly described herein, a wafer structure having a plurality of bonding pad, a under ball metallurgy (UBM) layer comprising a first metallic layer and a second metallic layer, a plurality of bump, a first passivation layer and a second passivation layer. The bonding pads are disposed on the active surface of the wafer and exposed by the first passivation layer. The second passivation layer is disposed on the first passivation layer. The first metallic layer is disposed on the bonding pad and covers a portion of the first passivation layer. The second passivation layer covers the first passivation layer and a portion of the first metallic layer. The second metallic layer is disposed on the first metallic layer and the bump are disposed on the second metallic layer.

The UBM layer comprises at least an adhesion layer disposed on the bonding pad, a barrier layer disposed on the adhesion layer and a wetting layer disposed between the barrier layer and the bump. Each of these layers can be a single layer or comprises a plurality of layers. The first metallic layer may include the adhesion layer, while the second metallic layer may include the barrier layer and the wetting layer. Alternatively, the first metallic layer may include the adhesion layer and the barrier layer, while the second metallic layer includes the wetting layer.

According to the present invention, since the first metallic layer covers a portion of the first passivation layer and the second passivation layer covers a portion of the first metallic layer, the stacked structure provides a higher structural strength. As the package structure is exposed to high temperature, the wafer structure described above can alleviate peeling induced by thermal stress and enhances connection between the bumps and the wafer.

The present invention also provides a bumping process for forming a plurality of bumps on a wafer. A wafer having a plurality of bonding pads and a first passivation layer covering an active surface of the wafer is provided. The bonding pads are disposed on the active surface of the wafer and are exposed by the first passivation layer. A first metallic layer is formed over the wafer and covers a portion of the first passivation layer. A second passivation layer is formed on the first passivation layer and covers a peripheral portion of the first metallic layer. A second metallic layer is formed on the first metallic layer and a plurality of bumps is formed on the second metallic layer.

According to the present invention, since the first metallic layer is formed before forming the second passivation layer, the first metallic layer covers a portion of the first passivation layer and the peripheral portion of the first metallic layer is covered by the second passivation layer. Hence, the resultant laminated structure has a higher structural strength. Hence, the bumping process provided herein affords better connection between the wafer and the bump structure, so that the performance of the device is improved and the life of the device is extended.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
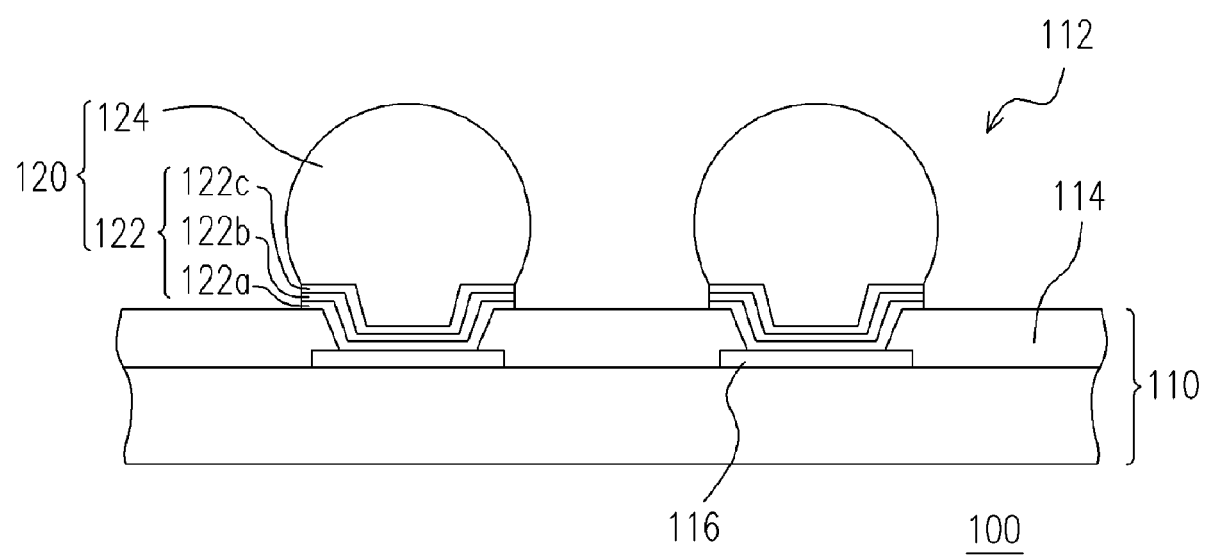
FIG. 1 is a cross-sectional view illustrating a conventional bump structure.
Figure 2A:
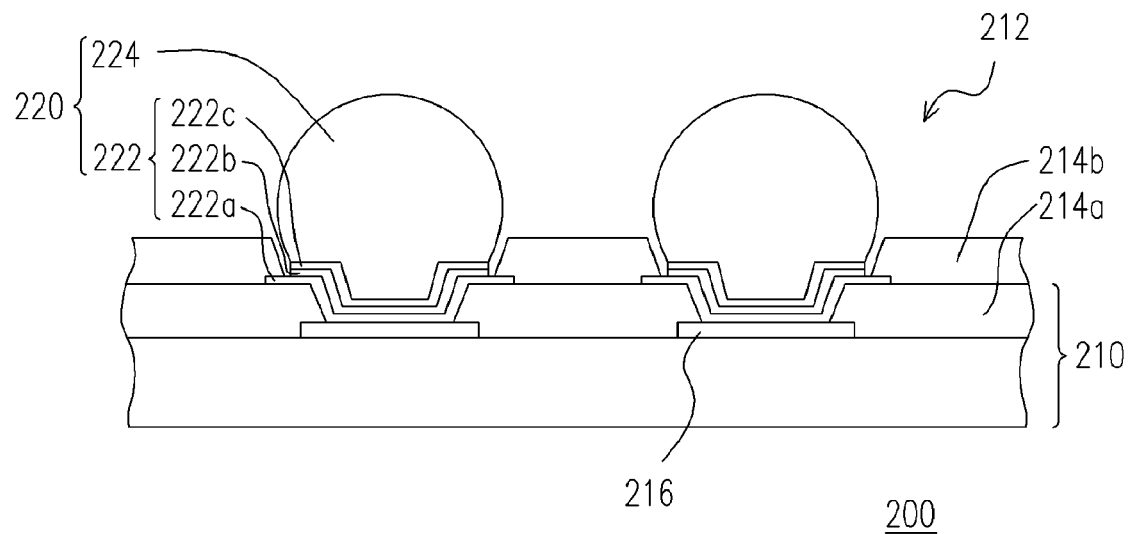
FIGS. 2A-2B are cross-sectional display views illustrating wafer structures according to preferred embodiments of this invention.
Figure 2B:
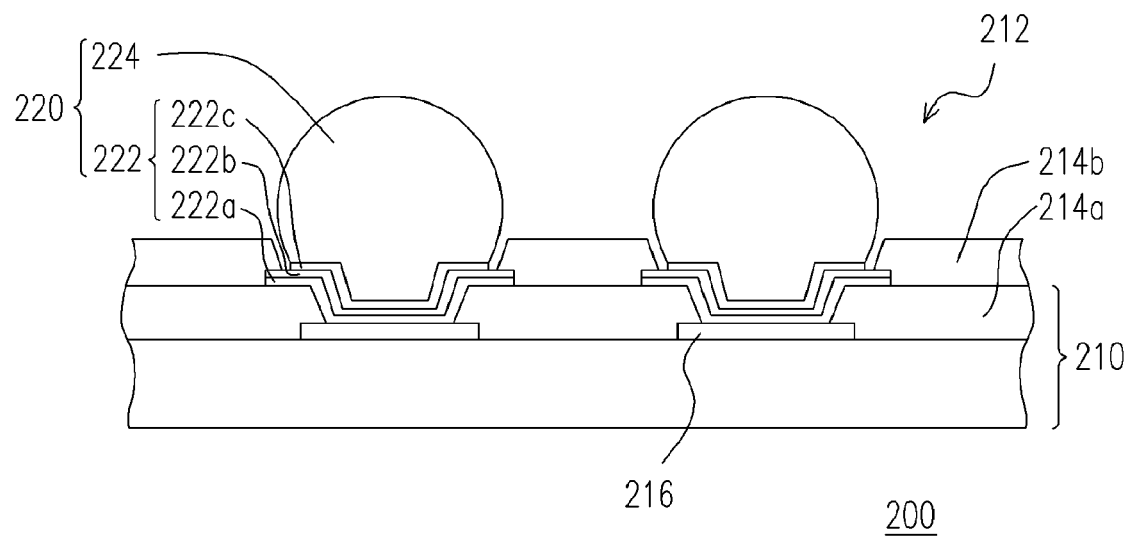

FIGS. 2A and 2B are cross-sectional display views respectively illustrating two wafer structures according to preferred embodiments of this invention. The same elements in two figures are marked with identical reference numbers.

Referring to FIG. 2A, the wafer structure 200 includes a wafer 210 and a plurality of bump structures 220 (only two bump structures are shown). The wafer 210 has an active surface 212, a first passivation layer 214a, a second passivation layer 214b, and a plurality of bonding pads 216 (with only two pads shown) on the active surface 212.

The bonding pads 216 are exposed by the firstpassivation layer 214a, while the first passivation layer 214a covers the active surface 212 of the wafer 210. It is noted that the active surface of the wafer is the surface having active devices of the wafer. The second passivation layer 214b is disposed on the first passivation layer 214a. The material of the second passivation layer 214b can be benzocyclobutene (BCB) or polyimide (PI), while the material of the bonding pad can be aluminum or copper.

Each of the bump structure 220 includes an under bump metallurgy (UBM) layer 222 and a solder bump 224. The UBM layer 222 is arranged between the bump 224 and the bonding pad 216, as an interface for connection. The bump 224 can act as an electrical contact of the wafer for external connection.

The UBM layer 222 at least includes an adhesion layer 222a, a barrier layer 222b, and a wetting layer 222c. The adhesion layer 222a is disposed on the bonding pad 216 and covers a portion of the first passivation layer 214a, while the second passivation layer 214b covers a peripheral portion of the adhesion layer 222a. The adhesion layer 222a can improve adhesion between the bonding pad 216 and the barrier layer 222b. The material of the adhesion layer 222a can be aluminum, titanium or tantalum, for example. The barrier layer 222b is disposed on the adhesion layer 222a, over the bonding pad 216. The barrier layer 222b can act as a barrier against diffusion reaction of the bump 224 or the underlying metal pad. The material of the barrier layer 222b can be nickel/vanadium (Ni/V) alloy, titanium nitride, tantalum nitride or nickel, for example. The wetting layer 222c is disposed on the barrier layer 222b, and can increase the attachment of the UBM layer 222 to the bumps 224. For example, the material of the wetting layer 222c can be copper, while the material of the bump 224 can be tin-lead alloy or lead free solder. The adhesion layer 222a covers a portion of the first passivation layer 214a and the second passivation layer 214b covers the peripheral portion of the adhesion layer 222a. The barrier layer 222b and the wetting layer 222c are not covered by the second passivation layer 214b.

In the above structure 200 described in the present invention, because the adhesion layer 222a covers a portion of the first passivation layer 214a and the peripheral portion of the adhesion layer 222a is covered by the second passivation layer 214b, the stacked structure of layers 214b/222a/214a has a higher structural strength. Therefore, as the package structure is exposed to repetitive temperature variation, the wafer structure described above can prevent peeling, induced by thermal stress, along the interface between the adhesion layer 222a and the first passivation layer 214a. Thus, for the wafer structure provided herein, better connection between the wafer 210 and the bump structure 220 is provided, so as to improve the performance of the device and extend the life of the device.

As shown in FIG. 2A, in the structure 200, the adhesion layer 222a covers a portion of the first passivation layer 214a and the peripheral portion of the adhesion layer 222a is covered by the second passivation layer 214b. Alternatively, as shown in FIG. 2B, another structure 200 can be formed with modifications. In the structure 200 shown in FIG. 2B, the barrier layer 222b and the adhesion layer 222a cover a portion of the first passivation layer 214a and the peripheral portions of the barrier layer 222b/adhesion layer 222a are covered by the second passivation layer 214b. The wetting layer 222c is not covered by the second passivation layer 214b.

In the above embodiments, although the adhesion layer 222a, the barrier layer 222b or the wetting layer 222c is exemplified as a single layer, each of these layer can be constituted from more than one layers of metallic material layers.

From the above embodiments, the UBM layer 222 includes a plurality of metallic (or metal) layers. According to the present invention, these metallic layer can be divided as the first metallic layer (metallic layer(s) with the first pattern; for example, the adhesion layer 222a in the structure of FIG. 2A or the adhesion layer/barrier layer 222a/222b in the structure of FIG. 2B) and the second metallic layer (metallic layer(s) with the second pattern; for example, the barrier layer/wetting layer 222b/222c in the structure of FIG. 2A or the wetting layer 222c in the structure of FIG. 2B). The first metallic layer (layer(s) with the first pattern) covers a portion of the first passivation layer 214a and the second passivation layer 214b covers a portion of the first metallic layer. On the other hand, the second passivation layer 214b does not cover the second metallic layer (layer(s) with the second pattern). No matter how many layers are included in the UBM layer, it is incorporated within the scope of the present invention, as long as the UBM layer includes the first and second metallic layers as described above.

FIGS. 3A-3F are cross-sectional display views illustrating a fabrication process step for the wafer structure according to one preferred embodiment of this invention, based on the structure of FIG. 2A.

Figure 3A:
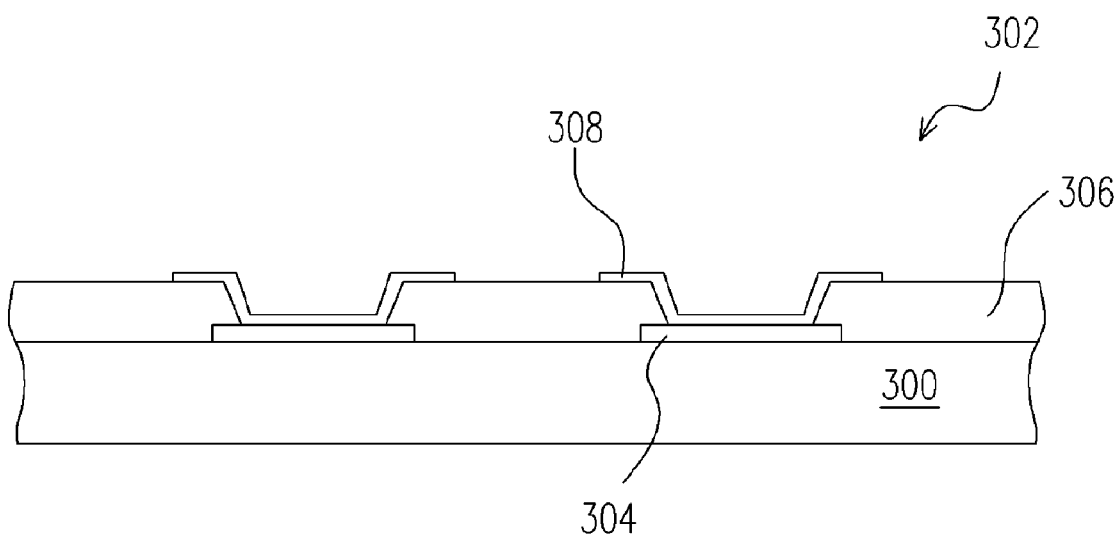
FIGS. 3A-3F are cross-sectional display views illustrating a fabrication process step for the wafer structure according to one preferred embodiment of this invention.

Referring to FIG. 3A, a wafer 300 having a plurality of bonding pads 304 (only two pads shown) is provided. A passivation layer 306 is formed over the active surface 302 of the wafer and the bonding pads 304 are exposed through the passivation layer 306. The material of the passivation layer 306 is, for example, silicon nitride. The material of the bonding pad 304 is aluminum or copper, for example.

Subsequently, an adhesion layer 308 is formed over the wafer 300 covering the exposed bonding pad 304 and a portion of the passivation layer 306. The adhesion layer 308 can be a single layer or a multi-layered structure. The adhesion layer 308 can be made of titanium, aluminum or tantalum, for example. The adhesion layer 308 can be formed by sputtering or evaporation, and then patterned by photolithography and etching, for example.

Figure 3B:
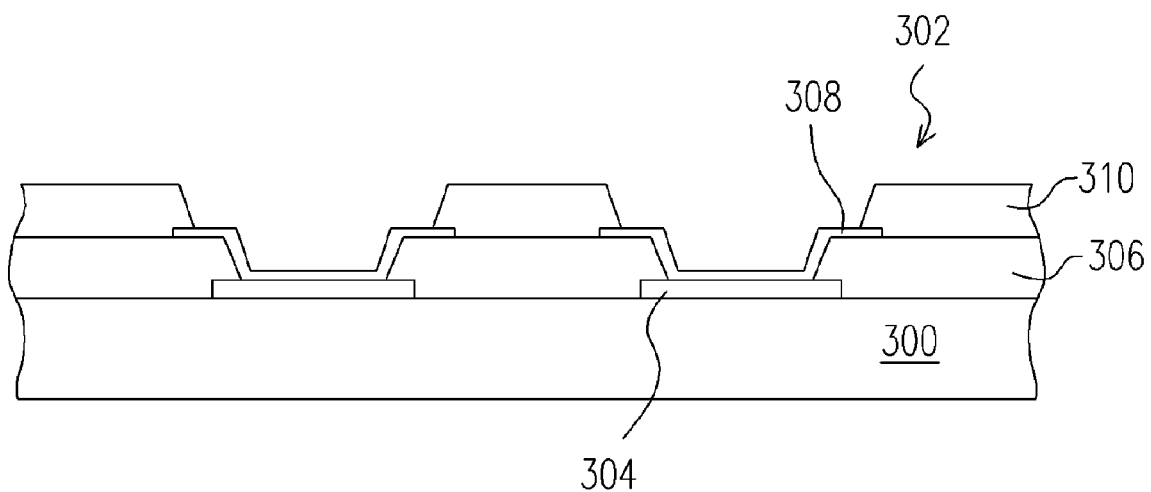

Referring to FIG. 3B, a passivation layer 310 is formed over the wafer 300, covering a peripheral portion of the adhesion layer 308 but exposing the adhesion layer 308 above the bonding pad 304. The material of the passivation layer 310 can be benzocyclobutene (BCB) or polyimide (PI). The passivation layer 310 can be formed by coating a polymer layer (of BCB or PI) over the wafer 300, and then patterned by photolithography and etching, for example.

Figure 3C:
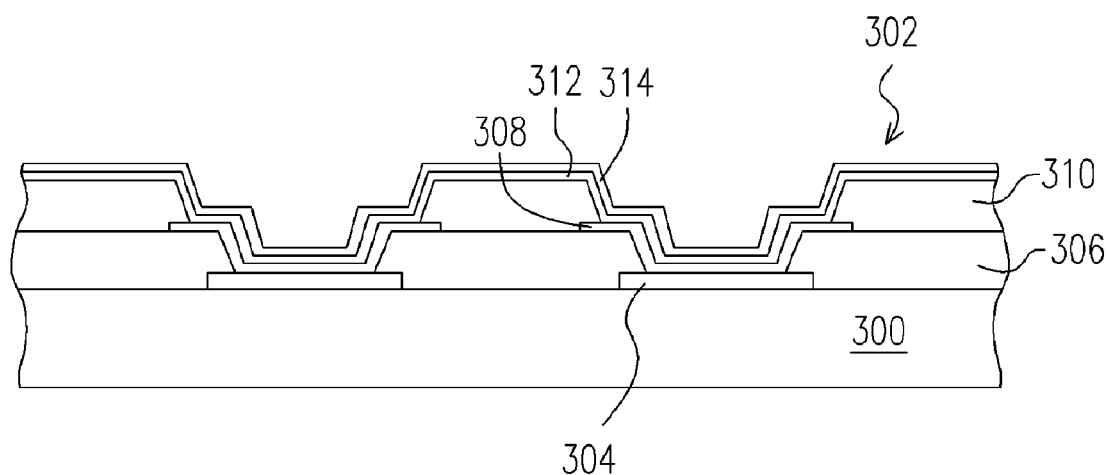

Referring to FIG. 3C, a barrier layer 312 is formed over the wafer 300. The material of the barrier layer 312 can be nickel/vanadium (Ni/V) alloy, titanium nitride, tantalum nitride or nickel, for example. The barrier layer 312 can be a single layer or a multi-layered structure. The barrier layer 312 can be formed by sputtering, plating or evaporation, for example. Following, a wetting layer 314 is formed over the wafer 300. For example, the material of the wetting layer 314 can be copper. The wetting layer 314 can be a single layer or a multi-layered structure, formed by sputtering, plating or evaporation, for example.

Figure 3D:
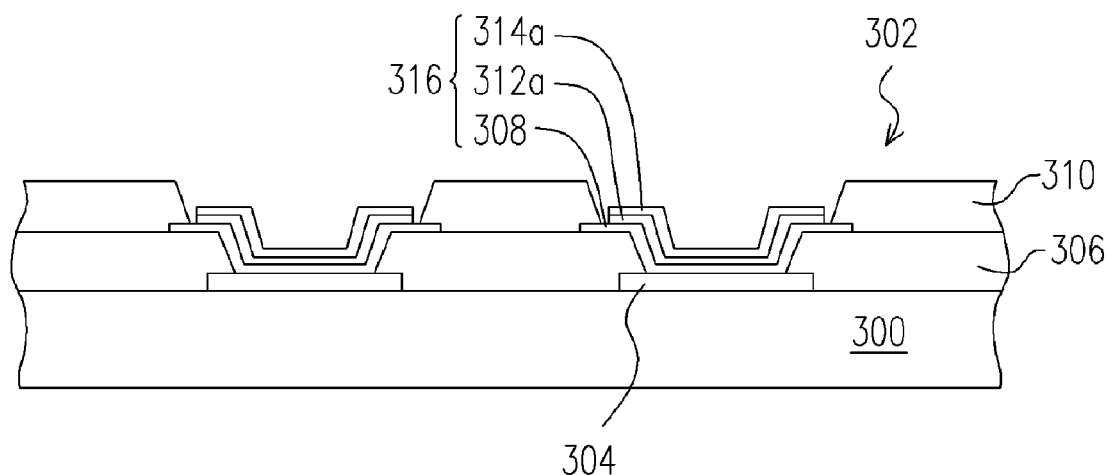

Referring to FIG. 3D, the barrier layer 312 and the wetting layer 314 are patterned by photolithography and etching, to form a patterned barrier layer 312a and a patterned wetting layer 314a, thus completing the fabrication of the UBM layer 316. The UBM layer 316 (222 in FIG. 2A) includes the adhesion layer 308, the patterned barrier layer 312a and the patterned wetting layer 314a. Preferably, if the bonding pad 304 is made of aluminum, the stacked structure 308/312a/314a of the UBM layer 316 are stacked Al/Ni—V alloy/Cu layers. Preferably, if the bonding pad 304 is made of copper, the stacked structure 308/312a/314a of the UBM layer 316 are stacked Ti/Ni—V alloy/Cu layers.

Figure 3E:
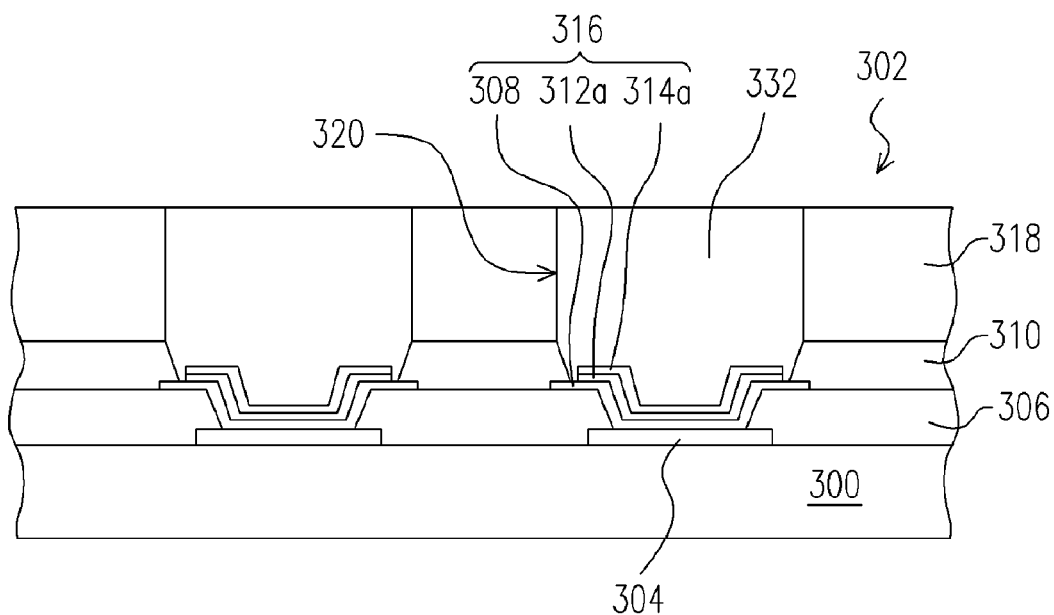

Referring to FIG. 3E, a patterned mask layer 318 with a plurality of openings 320 is formed over the wafer 300. The wetting layer 314a above the bonding pad 304 and a portion of the adhesion layer 308 on the passivation layer 306 are exposed by the openings 320. The patterned mask layer 318 can be formed by forming a photoresist layer (not shown) over the wafer 300 and then patterned by photolithography and development, for example.

After forming the patterned mask layer 318, a solder material 322 is filled into the openings 320 and disposed above the bonding pad 304, by printing, evaporation, plating or the other methods available so far, for example. The solder material 322 can be solder powder or solder paste, for example.

Figure 3F:
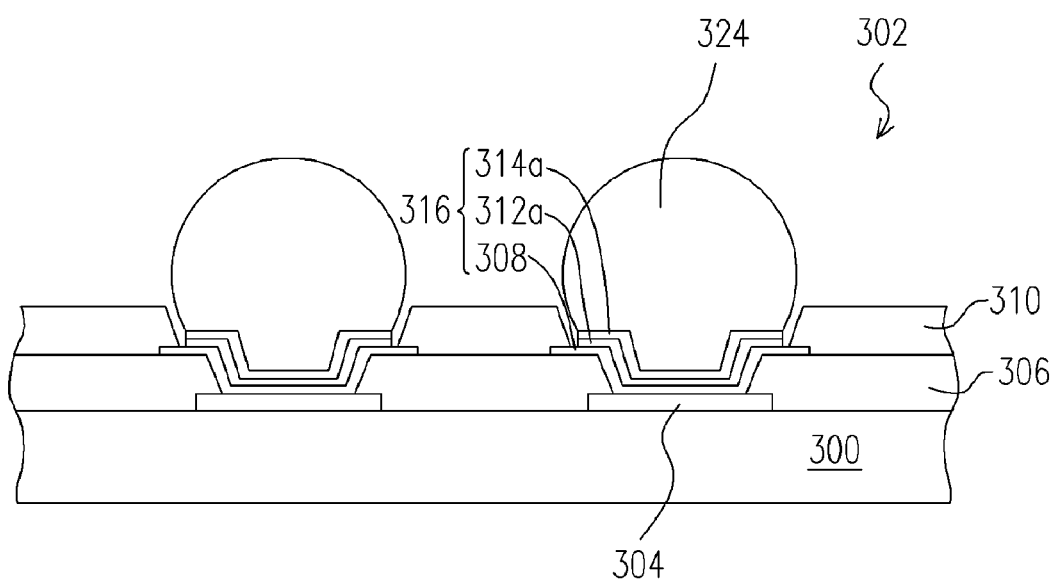

Referring to FIG. 3F, a reflux may be sprayed on the solder material 322 after removing the mask layer 318. The reflux can help melting the solder material 322 during the reflow step, so as to form bumps 324. Alternatively, the reflux 333 can be pre-mixed with the solder material 322 and filled into the openings 320, followed by performing the first reflow step to amalgamate the solder mixture and form bumps 324. However, if the bump 324 is not in ideal globular shape, it is applicable that the reflux 333 is sprayed again onto the bumps 324 and followed by the second reflow step to obtain bumps 324 in excellent globular shapes. On the other hand, in addition to globular bumps described in this embodiment, bumps in pillar or block shapes are also incorporated within the scope of this invention.

Alternatively, the barrier layer 312 and the wetting layer 314 are not patterned until the bumps 324 are formed. In this case, the step of forming the bumps 324 comprises first forming the patterned mask layer 318, and filling a solder material 322 into the openings 320 preferably by plating, for example. After filling the solder material 322, the barrier layer 312 and the wetting layer 314 are then patterned by using the solder material 322 thereon as masks. Optionally, after the reflow step and after the formation of the bumps 324 on the wetting layer 314, the barrier layer 312 and the wetting layer 314 are then patterned by using the bumps 324 thereon as masks. The patterned wetting layer 314a and barrier layer 312a are disposed above the bonding pad 304 without covering or being covered by the second passivation layer 310.

Because the adhesion layer 308 is formed before forming the second passivation layer 310, the adhesion layer 308 covers a portion of the first passivation layer 306 and the peripheral portion of the adhesion layer 308 is covered by the second passivation layer 310. Hence, the stacked structure of layers 306/308/310 has a higher structural strength. As the package structure is exposed to high temperature, the wafer structure described above can prevent peeling, induced by thermal stress, along the interface between the adhesion layer 308 and the first passivation layer 306. Thus, the bumping process provided herein could afford better connection between the wafer and the bump structure, so as to improve the performance of the device and extend the life of the device.

FIGS. 4A-4D are cross-sectional display views illustrating a fabrication process step for the wafer structure according to another preferred embodiment of this invention, based on the structure of FIG. 2B. The same elements as shown in FIGS. 3A-3F mark with the identical reference numbers.

Figure 4A:
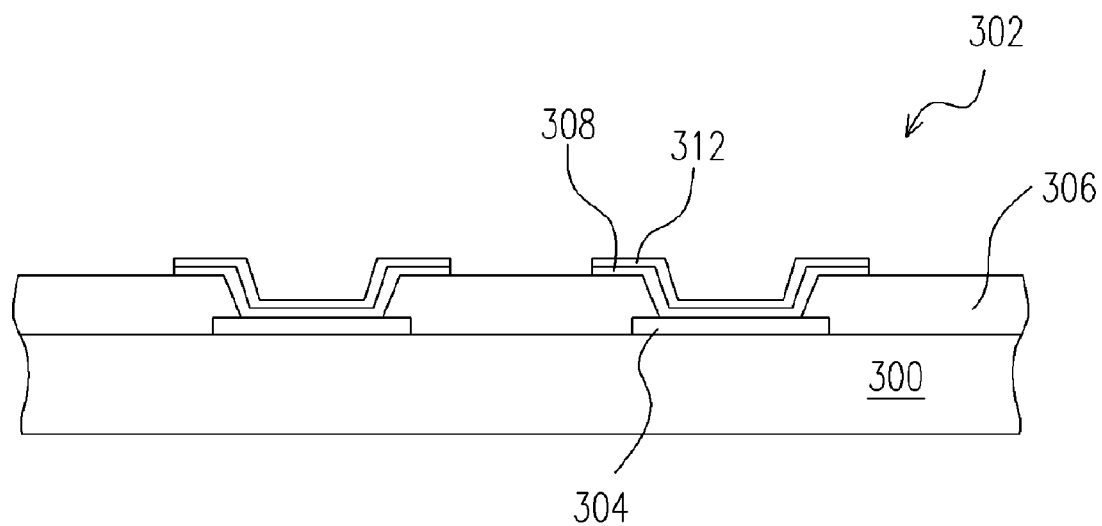
FIGS. 4A-4D are cross-sectional display views illustrating a fabrication process step for the wafer structure according to another preferred embodiment of this invention.

Referring to FIG. 4A, a wafer 300 having a plurality of bonding pads 304 (only two pads shown) is provided. A passivation layer 306 is formed over the active surface 302 of the wafer and the bonding pads 304 are exposed through the passivation layer 306. Afterwards, an adhesion layer 308 and a barrier layer 312 are sequentially formed over the wafer 300 covering the exposed bonding pad 304 and a portion of the passivation layer 306.

Figure 4B:
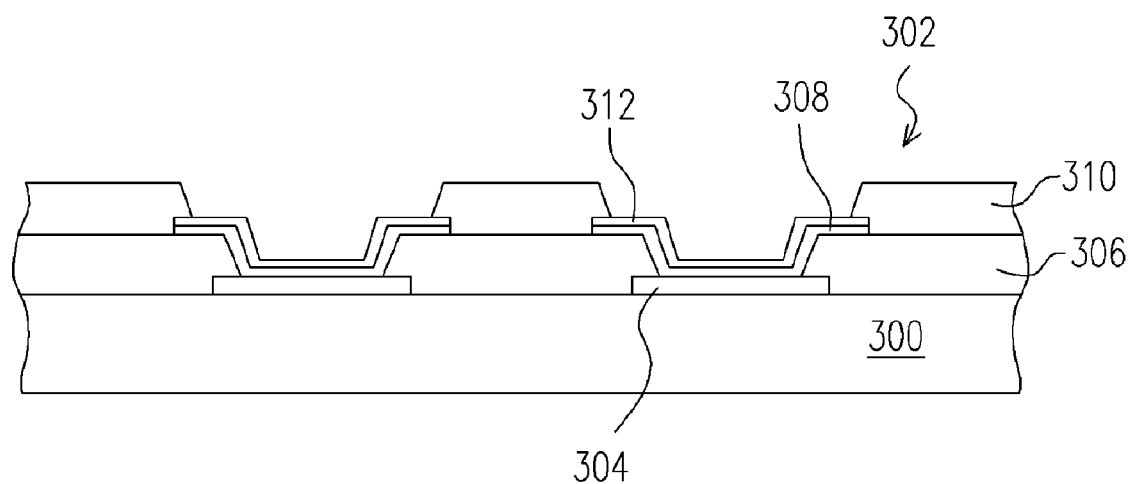

Referring to FIG. 4B, a passivation layer 310 is formed over the wafer 300, covering peripheral portions of the adhesion layer 308 and the barrier layer 312 but exposing the barrier layer 312 above the bonding pad 304.

Figure 4C:
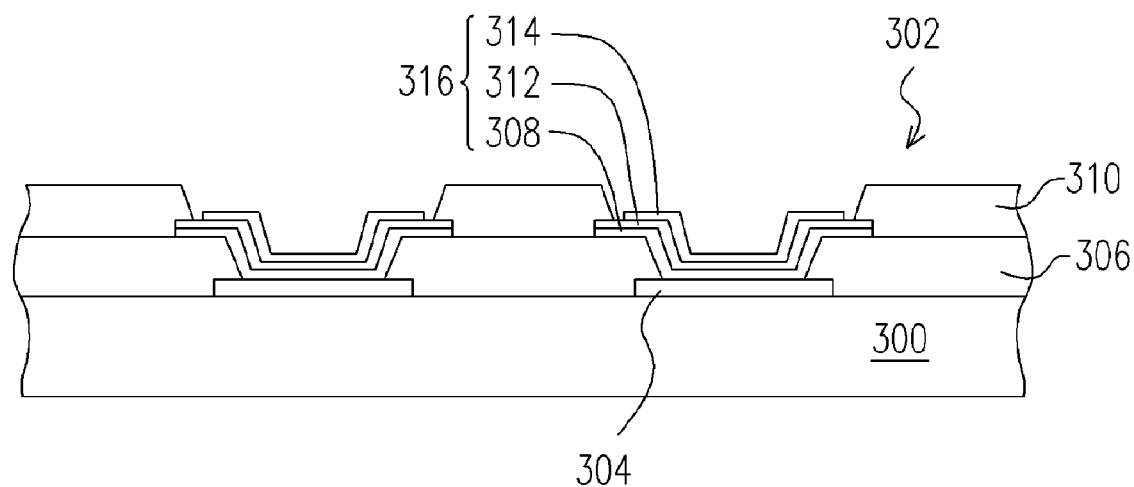

Referring to FIG. 4C, a wetting layer 314 is formed on the barrier layer 312. The wetting layer 314 is not covered by the passivation layer 310. The UBM layer 316 includes the adhesion layer 308, the barrier layer 312 and the wetting layer 314.

Figure 4D:
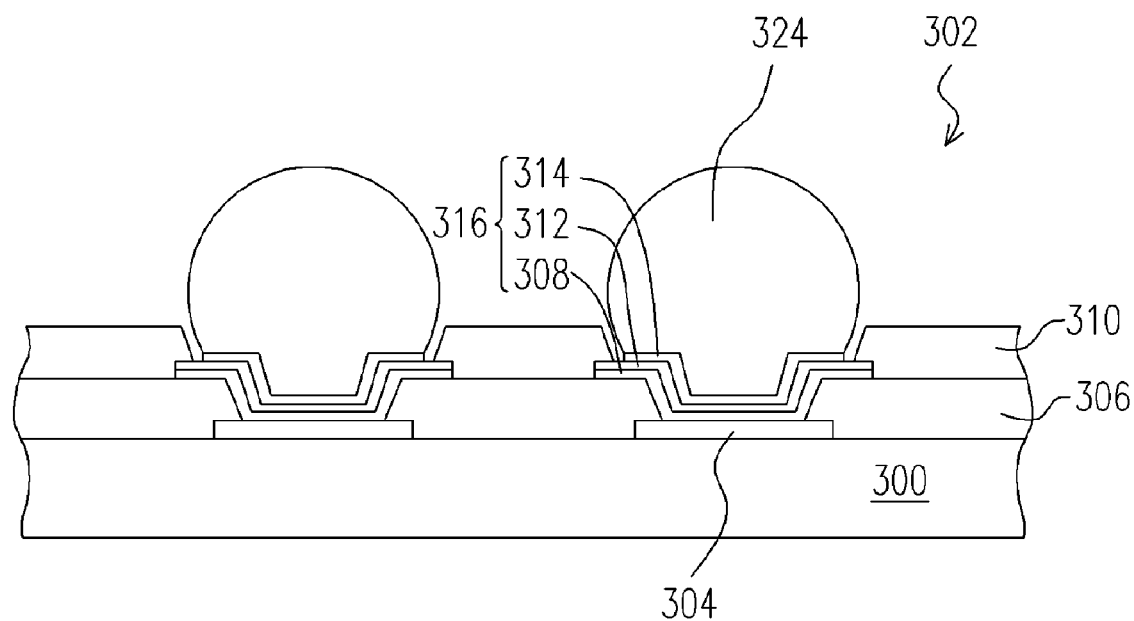

Referring to FIG. 4D, bumps 324 are formed on the wetting layer 314.

The wetting layer 314 that is not covered by the passivation layer 310 can be formed by first blanketly forming the wetting layer over the wafer 300 and then patterning the wetting layer by photolithography and etching. Alternatively, after the wetting layer 314 is blanketly formed over the wafer 300, the bumps 324 are formed preferably by plating on the wetting layer 314. After the formation of the bumps 324 on the wetting layer 314, the wetting layer 314 is patterned by using the bumps 324 thereon as masks.

Since the adhesion layer 308 and the barrier layer 312 are formed before forming the second passivation layer 310, the adhesion layer/barrier layer 308/312 cover a portion of the first passivation layer 306 and the peripheral portion of the adhesion layer/barrier layer 308/312 is covered by the second passivation layer 310. Hence, the stacked structure of layers 306/308/312/310 has a higher structural strength. As the package structure is exposed to high temperature, the wafer structure described above can prevent peeling, induced by thermal stress, along the interface between the adhesion layer 308 and the first passivation layer 306. Thus, the bumping process provided herein could afford better connection between the wafer and the bump structure, so as to improve the reliability of the bumps and the quality of the package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A wafer structure, comprising:
   a wafer having a plurality of bonding pads, wherein the bonding pads are disposed on an active surface of the wafer;
   a first passivation layer covering the active surface of the wafer, wherein the bonding pads are not fully covered by the first passivation layer;
   an under ball metallurgy (UBM) layer disposed on each of the bonding pads, wherein the UBM layer comprises a first metallic layer and a second metallic layer disposed on the first metallic layer, the first metallic layer permanently covering a portion of the first passivation layer, and the UBM layer above each of the bonding pads is detached from the others;
   a second passivation layer permanently disposed on the first passivation layer, wherein the second metallic layer of the UBM layer does not cover the second passivation layer, and the second passivation layer covers a peripheral portion of the first metallic layer, without covering the second metallic layer; and
   a plurality of bumps, disposed on the UBM layer.

2. The structure of claim 1, wherein the UBM layer comprises:
   an adhesion layer, disposed on the bonding pad;
   a barrier layer disposed on the adhesion layer;
   a wetting layer disposed between the barrier layer and the bump.

3. The structure of claim 2, wherein the adhesion layer is a single layer or comprises a plurality of layers.

4. The structure of claim 2, wherein the barrier layer is a single layer or comprises a plurality of layers.

5. The structure of claim 2, wherein the wetting layer is a single layer or comprises a plurality of layers.

6. The structure of claim 2, wherein the first metallic layer includes the adhesion layer and the second metallic layer includes the barrier layer and the wetting layer.

7. The structure of claim 2, wherein the first metallic layer includes the adhesion layer and the barrier layer and the second metallic layer includes the wetting layer.

8. The structure of claim 2, wherein a material of the adhesion layer is titanium or aluminum.

9. The structure of claim 2, wherein a material of the barrier layer is selected from the group consisting of nickel-vanadium alloy, titanium nitride, tantalum nitride and nickel.

10. The structure of claim 2, wherein a material of the wetting layer includes copper.

11. The structure of claim 2, wherein a material of the second passivation layer is benzocyclobutene (BCB) or polyimide (PI).

12. The structure of claim 2, wherein a material of the bumps includes tin/lead alloy.

13. The structure of claim 2, wherein the bumps are in globular shapes or pillar shapes.

14. The structure of claim 1, wherein the second metallic layer is within an opening of the second passivation layer, and the second metallic layer is not in contact with the second passivation layer.

* * * * *